United States Patent
Seo et al.

(10) Patent No.: US 8,169,353 B2
(45) Date of Patent: May 1, 2012

(54) WIDEBAND DIGITAL TO ANALOG CONVERTER WITH BUILT-IN LOAD ATTENUATOR

(75) Inventors: Dongwon Seo, San Diego, CA (US); Ganesh R Saripalli, San Diego, CA (US); Tongyu Song, San Diego, CA (US); Shahin Mehdizad Taleie, San Diego, CA (US); Derui Kong, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/686,998

(22) Filed: Jan. 13, 2010

(65) Prior Publication Data

US 2011/0074615 A1 Mar. 31, 2011

Related U.S. Application Data

(60) Provisional application No. 61/247,424, filed on Sep. 30, 2009.

(51) Int. Cl.
  *H03M 1/66* (2006.01)
(52) U.S. Cl. .................................... 341/144; 341/136
(58) Field of Classification Search .................. 341/144, 341/119, 134, 135, 136; 327/65, 89, 108
See application file for complete search history.

(56) References Cited

U.S. PATENT DOCUMENTS

| | | | |
|---|---|---|---|
| 6,353,404 B1 | 3/2002 | Kuroiwa | |
| 6,417,793 B1 | 7/2002 | Bugeja et al. | |
| 6,518,906 B2 * | 2/2003 | Abel et al. | 341/144 |
| 6,566,951 B1 * | 5/2003 | Merrigan et al. | 330/254 |
| 6,605,990 B2 * | 8/2003 | Vermeeren | 330/9 |
| 6,668,164 B2 | 12/2003 | Hughes | |
| 6,738,006 B1 | 5/2004 | Mercer et al. | |
| 6,900,752 B2 * | 5/2005 | Oda et al. | 341/154 |
| 7,058,371 B2 * | 6/2006 | Li et al. | 455/116 |
| 7,158,065 B2 * | 1/2007 | Lin et al. | 341/144 |
| 7,199,742 B2 * | 4/2007 | Lin et al. | 341/144 |
| 7,528,754 B1 | 5/2009 | Bakkaloglu et al. | |
| 2004/0080441 A1 * | 4/2004 | Plymale et al. | 341/144 |
| 2007/0129030 A1 | 6/2007 | Litmanen et al. | |
| 2009/0174587 A1 | 7/2009 | Ogawa et al. | |
| 2009/0201186 A1 | 8/2009 | Huang et al. | |

OTHER PUBLICATIONS

Dominik Przyborowski, et al., "Development of a general purpose low-power small-area 10 bit current steering CMOS DAC", Mixed Design of Integrated Circuits&Systems, 2009. Mixdes 09. Mixdes-16th International Conference, IEEE, Piscataway, NJ, USA, Jun. 25, 2009, pp. 256-261, XP031548247.

Fang Chen, et al., "Design of a wideband low-power continuous-time I GBP I modulator in 90 nm CMOS technology", Analog Integrated Circuits and Signal Processing, Kluwer Academic Publishers, BO, vol. 54, No. 3, Feb. 15, 2008, pp. 187-199, XP019569109.

International Search Report and Written Opinion—PCT/US2010/051007, International Search Authority—European Patent Office—Feb. 7, 2011.

* cited by examiner

*Primary Examiner* — Peguy Jean Pierre
(74) *Attorney, Agent, or Firm* — William M. Hooks

(57) ABSTRACT

A circuit for digital-to-analog conversion is described. The circuit includes a digital-to-analog converter (DAC). The DAC includes a double cascaded current source and a differential current-mode switch (DCMS). The circuit further includes a direct current (DC) offset stage. The circuit also includes a load attenuator. The double cascaded current source may be between the DCMS and a rail voltage.

30 Claims, 9 Drawing Sheets

US 8,169,353 B2

WIDEBAND DIGITAL TO ANALOG CONVERTER WITH BUILT-IN LOAD ATTENUATOR

RELATED APPLICATIONS

This application is related to and claims priority from U.S. Provisional Patent Application Ser. No. 61/247,424 filed Sep. 30, 2009, for "Wideband Digital to Analog Converter with Built-In Load Attenuator."

TECHNICAL FIELD

The present disclosure relates generally to communication systems. More specifically, the present disclosure relates to systems and methods for a wideband digital to analog converter with built-in load attenuator.

BACKGROUND

Wireless communication systems are widely deployed to provide various types of communication content such as voice, video, data, and so on. These systems may be multiple-access systems capable of supporting simultaneous communication of multiple wireless communication devices with one or more base stations.

Wireless communication devices may be battery operated mobile devices. Thus, decreases in the power consumption of a wireless communication device may lead to an increase in battery life for the wireless communication device.

A wireless communication device may include both analog and digital circuitry. For example, signal processing within the wireless communication device may be performed by digital circuitry while the actual transmission of signals to and from the wireless communication device may be performed using analog circuitry. Wireless communication devices may make use of digital to analog converters (DACs) which convert a digital signal to an analog signal for use by analog circuitry.

As the bandwidth and data rates used in wireless communication systems have increased, DACs capable of operating across a wider spectrum at higher data rates have become increasingly important. Benefits may be realized by implementing wideband DACs with relatively low power consumption.

DETAILED DESCRIPTION

Figure 1:
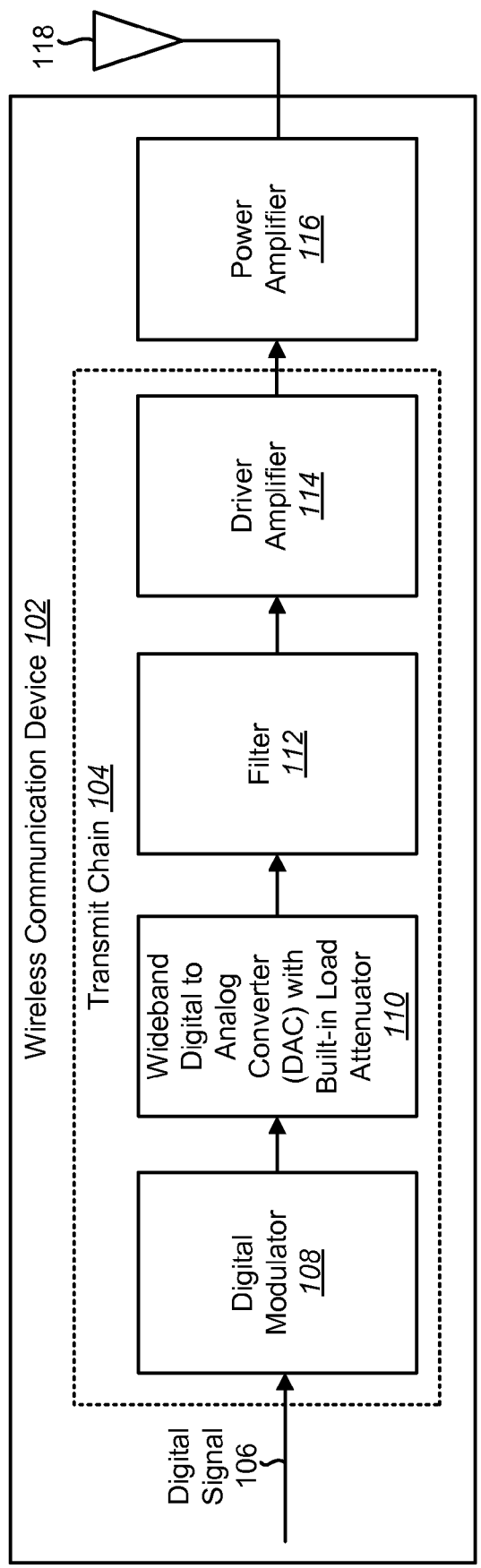
FIG. 1 illustrates various components of a wireless communication device.

A circuit for digital-to-analog conversion is described. The circuit includes a digital-to-analog converter (DAC) that includes a double cascaded current source and a differential current-mode switch (DCMS). The circuit also includes a direct current (DC) offset stage. The circuit further includes a load attenuator.

The double cascaded current source may be between the DCMS and a rail voltage. Outputs of the DAC may be input into the load attenuator. Outputs of the DC offset stage may be input into the load attenuator. The double cascaded current source may include a first p-type metal-oxide-semiconductor (PMOS) transistor. The source of the first PMOS transistor may be connected to a rail voltage and the gate of the first PMOS transistor may be connected to a first bias voltage. The double cascaded current source may also include a second PMOS transistor. The source of the second PMOS transistor may be connected to the drain of the first PMOS transistor and the gate of the second PMOS transistor may be connected to a second bias voltage.

A resistance of the DAC from the load attenuator may be equal to a transconductance of the second PMOS transistor times a first resistance times a second resistance. The first resistance may be the resistance from the drain to the source of the second PMOS transistor, and the second resistance may be the resistance from the drain to the source of the first PMOS transistor.

The DCMS may include a first p-type metal-oxide-semiconductor (PMOS) transistor. The source of the first PMOS transistor may be connected to an output of the double cascaded current source. The gate of the first PMOS transistor may be connected to a first data input, and the drain of the first PMOS transistor may be connected to a first output. The DCMS may also include a second PMOS transistor. The source of the second PMOS transistor may be connected to the output of the double cascaded current source. The gate of the second PMOS transistor may be connected to a second data input and the drain of the second PMOS transistor may be connected to a second output.

The DC offset stage may include a first p-type metal-oxide-semiconductor (PMOS) transistor. The source of the first PMOS transistor may be connected to a rail voltage, the drain of the first PMOS transistor may be connected to a first output, and the gate of the first PMOS transistor may be connected to a PMOS bias voltage (VBP). The DC offset stage may also include a second PMOS transistor. The source of the second PMOS transistor may be connected to a rail voltage, the drain of the second PMOS transistor may be connected to a second output, and the gate of the second PMOS transistor may be connected to VBP.

The load attenuator may include a first amplifier. A positive input of the first amplifier may receive a first reference signal. The load attenuator may also include a first p-type metal-oxide-semiconductor (PMOS) transistor. The source of the first PMOS transistor may be connected to a first input of the load attenuator and to a negative input of the first amplifier, the gate of the first PMOS transistor may be connected to the output of the first amplifier, and the drain of the first PMOS transistor may be connected to a first output of the load attenuator. The load attenuator may further include a second amplifier. A positive input of the second amplifier may receive a second reference signal. The load attenuator may also include a second PMOS transistor. The source of the second PMOS transistor may be connected to a second input of the load attenuator and to a negative input of the second amplifier, the gate of the second PMOS transistor may be connected to an output of the second amplifier, and the drain of the second PMOS transistor may be connected to a second output of the load attenuator.

The first and second amplifiers may have a transfer function. The first PMOS transistor and the second PMOS transistor may have a transconductance. A resistance of the load attenuator from the DAC may be one over the quotient of the transfer function and the transconductance. A ratio of a resistance of the DAC from the load attenuator to a resistance of the load attenuator from the DAC may not be limited by a load resistance.

Output swings may not be shown in the DAC, reducing the signal/code dependent behavior of the DAC. Additional currents required by the load attenuator may be supplied by the DC offset stage. A low impedance of an input node of the load attenuator may enable the fast discharge of glitch energy. The circuit may also include a filter connected to an output of the load attenuator. The DAC may be a low-power high-resolution wideband DAC.

A method for implementing a wideband digital to analog converter (DAC) with built-in load attenuator is also described. A current is generated by a current source that is a double cascaded current source. The generated current is applied to a differential current-mode switch (DCMS). A digital signal is converted to an analog signal using the DCMS. The analog signal is passed through a load attenuator. The method may also include adding a direct current (DC) component to the analog signal using a DC offset stage.

A wireless device having a wideband digital to analog converter (DAC) with built-in load attenuator is described. The wireless device includes means for generating a current by a current source. The current source is a double cascaded current source. The wireless device also includes means for applying the generated current to a differential current-mode switch (DCMS). The wireless device further includes means for converting a digital signal to an analog signal using the DCMS. The wireless device also includes means for passing the analog signal through a load attenuator.

A computer-program product for a wideband digital to analog converter (DAC) with built-in load attenuator is also described. The computer-program product includes a computer-readable medium having instructions thereon. The instructions include code for generating a current by a current source that is a double cascaded current source. The instructions also include code for applying the generated current to a differential current-mode switch (DCMS). The instructions further include code for converting a digital signal to an analog signal using the DCMS. The instructions also include code for passing the analog signal through a load attenuator.

FIG. 1 illustrates various components of a wireless communication device 102. The wireless communication device 102 may be used in a wireless communication system. A wireless communication device 102 may also be referred to as, and may include some or all of the functionality of, a terminal, an access terminal, a user equipment (UE), a subscriber unit, a station, a mobile station etc. A wireless communication device 102 may be a cellular phone, a personal digital assistant (PDA), a wireless device, a wireless modem, a handheld device, a laptop computer, etc.

A wireless communication device 102 may communicate with zero, one, or multiple base stations on the downlink (DL) and/or uplink (UL) at any given moment. The downlink (or forward link) refers to the communication link from a base station to the wireless communication device 102, and the uplink (or reverse link) refers to the communication link from the wireless communication device 102 to the base station.

Wireless communication systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems, and spatial division multiple access (SDMA) systems.

The wireless communication device 102 may be used in wireless communication systems such as long term evolution (LTE) and Data Only Revision B with 7 Megahertz (MHz) bandwidth (DorB7). Wireless communication systems such as LTE and DorB7 may continuously drive high data rates or bandwidth. An increased bandwidth may require an increased bandwidth of digital to analog converters (DACs). For example, increased bandwidth may require a wideband DAC. A wideband DAC may refer to a DAC capable of handling a wide range of frequencies. The increased bandwidth of DACs may allow the realistic implementation of digital pre-distortion (DPD) techniques in a system-on-a-chip (SOC). The use of DPD may allow low-cost non-linear power amplifiers (PAs) to be adopted into wireless systems by linearizing the PAs to acceptable levels. DPD techniques and low-cost non-linear PAs are discussed in further detail below in relation to FIG. 8.

The wireless communication device 102 may include a transmit chain 104. The transmit chain 104 may prepare signals for transmission. For example, the transmit chain 104 may receive a digital signal 106 for transmission. A digital modulator 108 may modulate the digital signal 106. For example, the digital modulator 108 may apply modulation schemes for CDMA or OFDMA. The modulated digital signal may then be converted to an analog signal using a wideband DAC with built-in load attenuator 110. The converted analog signal may then be filtered using a filter 112. The filtered signal may be amplified by a driver amplifier 114. The amplified signal may be further amplified using a power amplifier 116. The signal may then be transmitted by the wireless communication device 102 using an antenna 118.

Low-power wireless or consumer devices may require a DAC that operates with less current. In such applications, dynamic linearity performances that include signal-to-noise and distortion ratio (SNDR), spurious free dynamic range (SFDR) and total harmonic distortion (THD) are key specifications of interest to meet the system requirements.

A high resolution wideband DAC architecture that operates with less current may be well suited for wireless communication devices 102. Other wideband DACs have relied on relatively high power consumption to achieve the wide bandwidth, which made usage in battery-operated devices inappropriate. Furthermore, these wideband DACs did not show a wise use of power dissipation. The wideband DAC with built-in load attenuator 110 may be low-spurious and have optimal power consumption.

Figure 2:
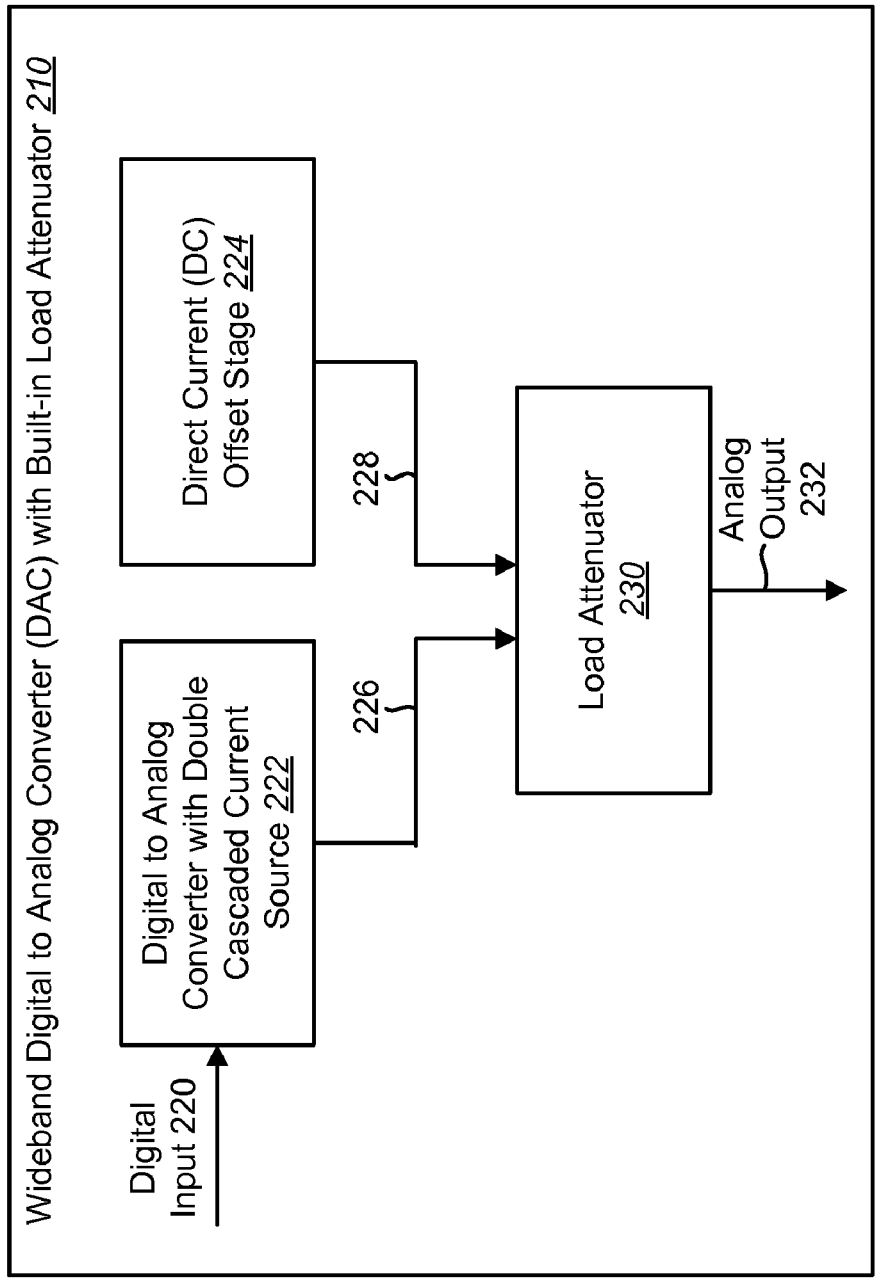
FIG. 2 is a block diagram illustrating data flows for a wideband digital to analog converter with built-in load attenuator.

FIG. 2 is a block diagram illustrating data flows for a wideband digital to analog converter with built-in load attenuator 210. The wideband DAC with built-in load attenuator 210 may include a DAC with double cascaded current source 222. The DAC with double cascaded current source 222 may receive a digital input signal 220. The DAC with double cascaded current source 222 is discussed in additional detail below in relation to FIG. 4. The output 226 of the DAC with double cascaded current source 222 may be input to a load attenuator 230. The load attenuator 230 may also receive the output 228 of a direct current (DC) offset stage 224. The load attenuator 230 may be built into the wideband DAC with built-in load attenuator 210. The load attenuator 230 may improve the performance of the DAC with double cascaded current source 222. For example, the load attenuator 230 may ensure that the performance of the DAC with double cascaded current source 222 is not limited by the load resistance or by various external interfaces. The load attenuator 230 may then output an analog output 232.

Figure 3:
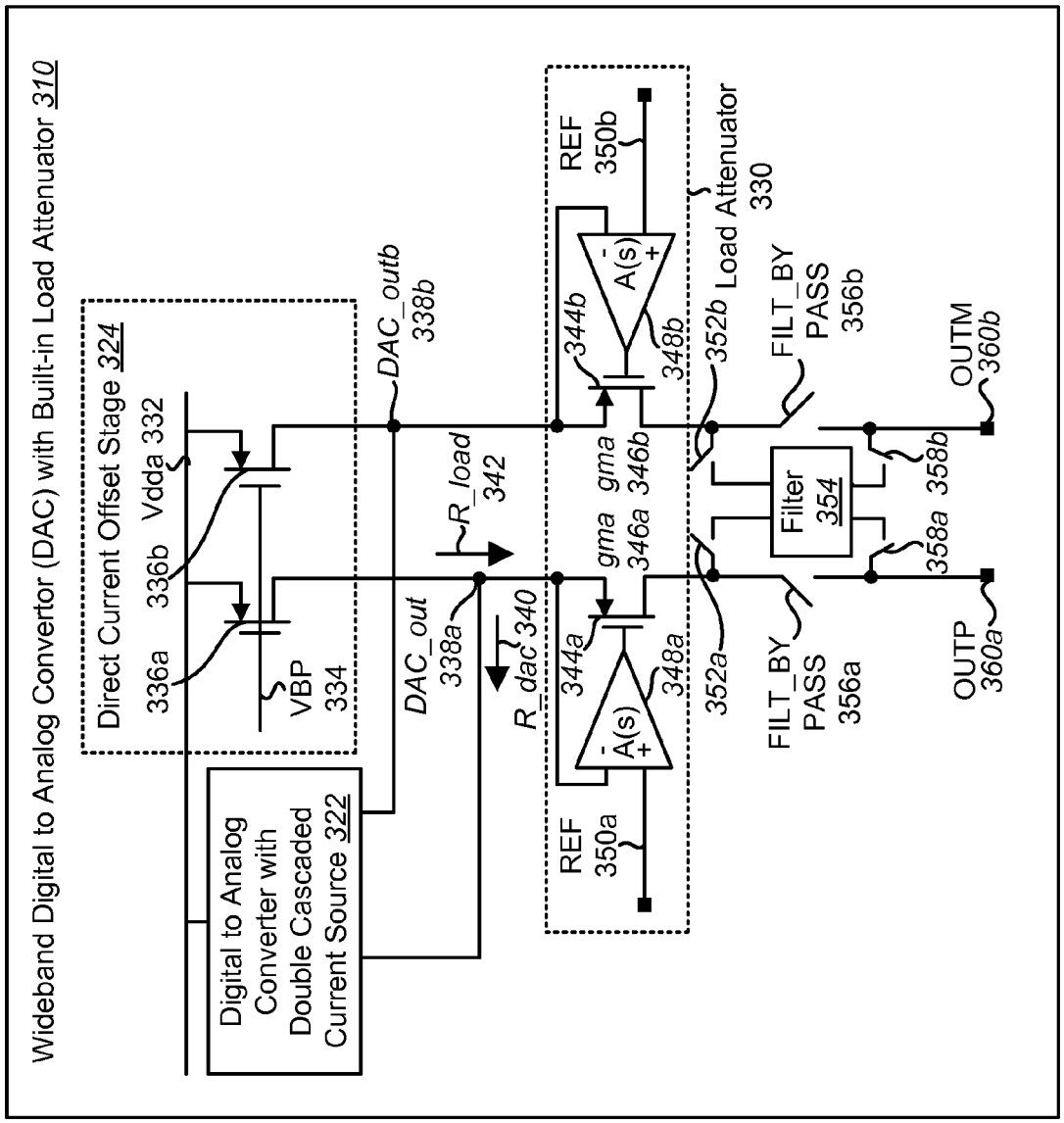
FIG. 3 is a circuit diagram illustrating a wideband DAC with built-in load attenuator.

FIG. 3 is a circuit diagram illustrating a wideband DAC with built-in load attenuator 310. The wideband DAC with built-in load attenuator 310 of FIG. 3 may be one configuration of the wideband DAC with built-in load attenuator 210 of FIG. 2. The wideband DAC with built-in load attenuator 310 may include a DAC with double cascaded current source 322. The DAC with double cascaded current source 322 may be connected to a rail voltage Vdda 332. The DAC with double cascaded current source 322 may have two outputs DAC_out 338a and DAC_outb 338b. From the outputs 338 of the DAC with double cascaded current source 322 looking towards the DAC with double cascaded current source 322, the DAC impedance R_dac 340 may be observed. R_dac 340 is discussed in additional detail below in relation to FIG. 5.

The wideband DAC with built-in load attenuator 310 may include a direct current (DC) offset stage 324. The DC offset stage 324 may add a DC component to the analog outputs 338 of the DAC with double cascaded current source 322. The DC offset stage 324 may also provide additional currents for the proper operation of a load attenuator 330. The additional currents may be approximately 25% of normal DAC currents. The DC offset stage 324 may include a first p-type metal-oxide semiconductor (PMOS) transistor 336a and a second PMOS transistor 336b. The source of the first PMOS transistor 336a may be connected to the rail voltage Vdda 332. The gate of the first PMOS transistor 336a may be connected to the PMOS bias voltage (VBP) 334. The drain of the first PMOS transistor 336a may be connected to DAC_out 338a. The source of the second PMOS transistor 336b may be connected to the rail voltage Vdda 332 and the gate of the second PMOS transistor 336b may be connected to VBP 334. The drain of the second PMOS transistor 336b may be connected to DAC_outb 338b.

DAC_out 338a may be connected to a first input of a load attenuator 330. DAC_outb 338b may be connected to a second input of the load attenuator 330. The load attenuator 330 may include a third PMOS transistor 344a. The source of the third PMOS transistor 344a may be connected to the first input of the load attenuator 330. Thus, the source of the third PMOS transistor 344a may be connected to DAC_out 338a. The source of the third PMOS transistor 344a may also be connected to a negative input of a first amplifier 348a. A reference signal REF 350a may be connected to a positive input of the first amplifier 348a. The first amplifier 348a may have a voltage transfer function A(s). The output of the first amplifier 348a may be connected to the gate of the third PMOS transistor 344a. The drain of the third PMOS transistor 344a may be connected to a first output of the load attenuator 330. The third PMOS transistor 344a may have a transconductance of gma 346a.

The load attenuator 330 may include a fourth PMOS transistor 344b. The source of the fourth PMOS transistor 344b may be connected to the second input of the load attenuator 330. Thus, the source of the fourth PMOS transistor 344b may be connected to DAC_outb 338b. The source of the fourth PMOS transistor 344b may also be connected to a negative input of a second amplifier 348b. The second amplifier 348b may have a voltage transfer function A(s). A reference signal REF 350b may be connected to a positive input of the second amplifier 348b. The output of the second amplifier 348b may be connected to the gate of the fourth PMOS transistor 344b. The drain of the fourth PMOS transistor 344b may be connected to a second output of the load attenuator 330. The fourth PMOS transistor 344b may have a transconductance of gma 346b.

The first output of the load attenuator 330 may be connected to a first switch 352a. When the first switch 352a is in a closed position, the first output of the load attenuator 330 may be connected to a filter 354. The first output of the load attenuator 330 may also be connected to a second switch 356a. The second switch 356a may be referred to as a filter bypass switch. When the second switch 356a is in the closed position, the first output of the load attenuator 330 is connected to a first output OUTP 360a of the wideband DAC with built-in load attenuator 310. A third switch 358a may connect the filter 354 to the first output OUTP 360a.

The second output of the load attenuator 330 may be connected to a fourth switch 352b. When the fourth switch 352b is in a closed position, the second output of the load attenuator 330 may be connected to the filter 354. The second output of the load attenuator 330 may also be connected to a fifth switch 356b. The fifth switch 356b may be a filter bypass switch. When the fifth switch 356b is in the closed position, the second output of the load attenuator 330 is connected to a second output OUTM 360b of the wideband DAC with built-in load attenuator 310. A sixth switch 358b may connect the filter 354 to the second output OUTM 360b.

The load resistance R_load 342 from the DAC with double cascaded current source 322 looking towards the load attenuator 330 may be calculated using Equation 1:

$$R\_load = \frac{1}{A(s) \cdot gm_a}. \tag{1}$$

The load attenuator 330 may function as an isolation stage. Therefore, any voltage swing of post-attenuator blocks is not seen by the DAC 322 and has no impact on the performance of the DAC 322. Thus, the impact of code dependent behavior may be minimized. A low impedance node of the DAC output 338 (input node of load attenuator 330) may enable the fast discharge of glitch energy. Dynamic performances may be improved accordingly.

The overhead currents for the wideband DAC with built-in load attenuator 310 include the DC offset currents and DC bias currents for the load attenuator 330. The DC offset currents are required for the load attenuator 330 to be functional over the entire operating region. The total required overhead currents for implementing the wideband DAC with built-in load attenuator 310 may be about 25% of prior arts using a current folding stage.

The wideband DAC with built-in load attenuator 310 may be easily reconfigured to a low-power backward-compatible mode for applications that do not need wideband performance by disabling the load attenuator 330 and DC offset current stage 324. The wideband DAC with built-in load attenuator 310 may potentially provide room to integrate post-filtering stages after the load attenuator 330. Due to the nature of differential circuits, the area of capacitance may be reduced to one-half compared to the filter implementation in single-ended mode.

Because the load attenuator 330 works as an isolator, the smallest feature sizes for DAC current switches may be used, thereby improving the bandwidth as well as dynamic performance. A DAC current switch may be a differential current-mode switch (DCMS). A DCMS is discussed in additional detail below in relation to FIG. 4. Without the isolation stage, the sizes of current switches may be determined by input/output electrostatic discharge (ESD) rules. Thus, without the isolation stage, the sizes of the current switches may be much larger.

Figure 4:
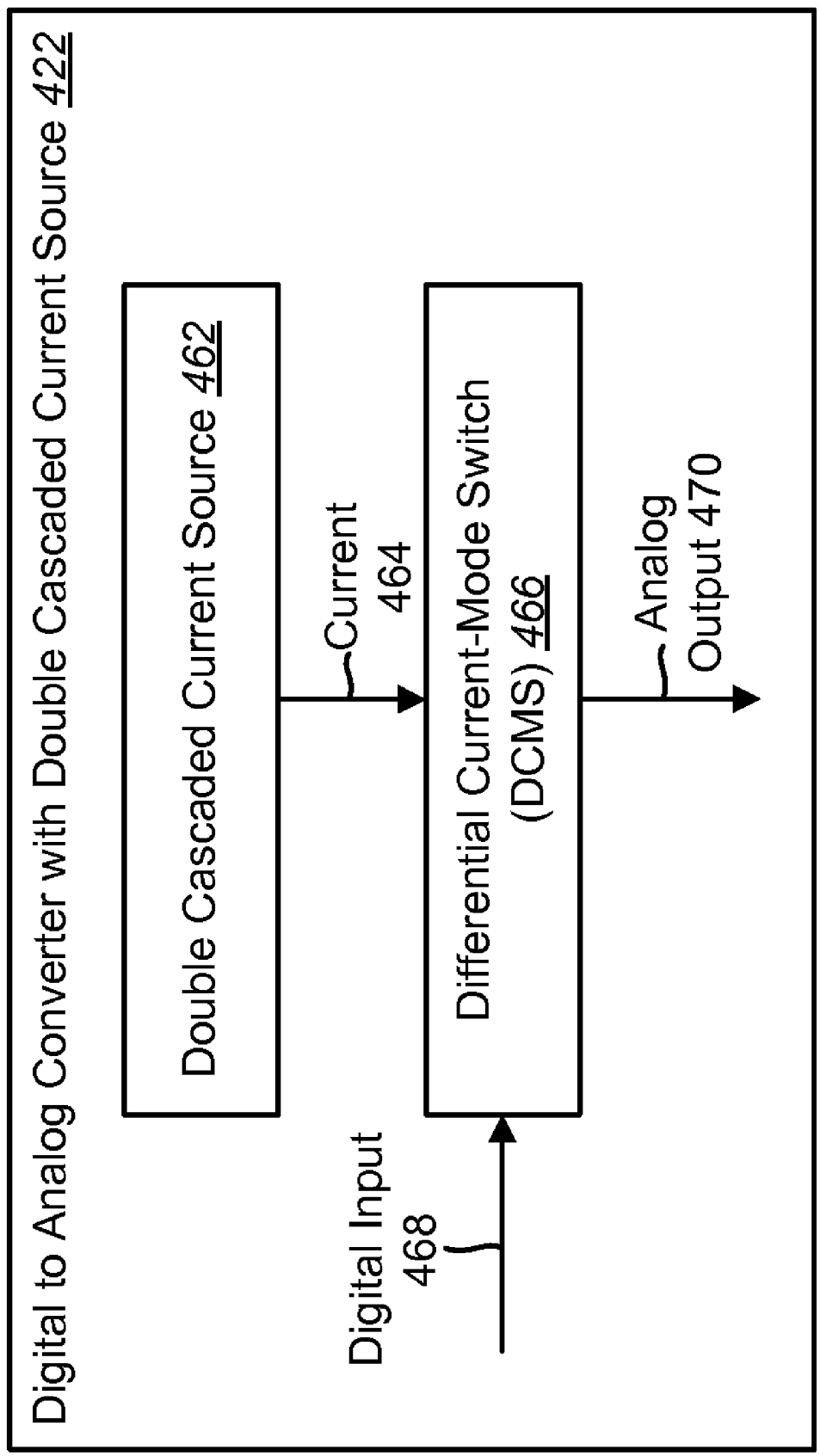
FIG. 4 is a block diagram illustrating a DAC with double cascaded current source.

FIG. 4 is a block diagram illustrating a DAC with double cascaded current source 422. The DAC with double cascaded current source 422 of FIG. 4 may be one configuration of the DAC with double cascaded current source 222 of FIG. 2. The DAC with double cascaded current source 422 may include a double cascaded current source 462. The double cascaded current source 462 is discussed in additional detail below in relation to FIG. 5. The double cascaded current source 462 may provide a current 464 to a Differential Current-Mode Switch (DCMS) 466. The DCMS 466 may receive a digital input 468. The DCMS 466 may then generate an analog output 470.

Figure 5:
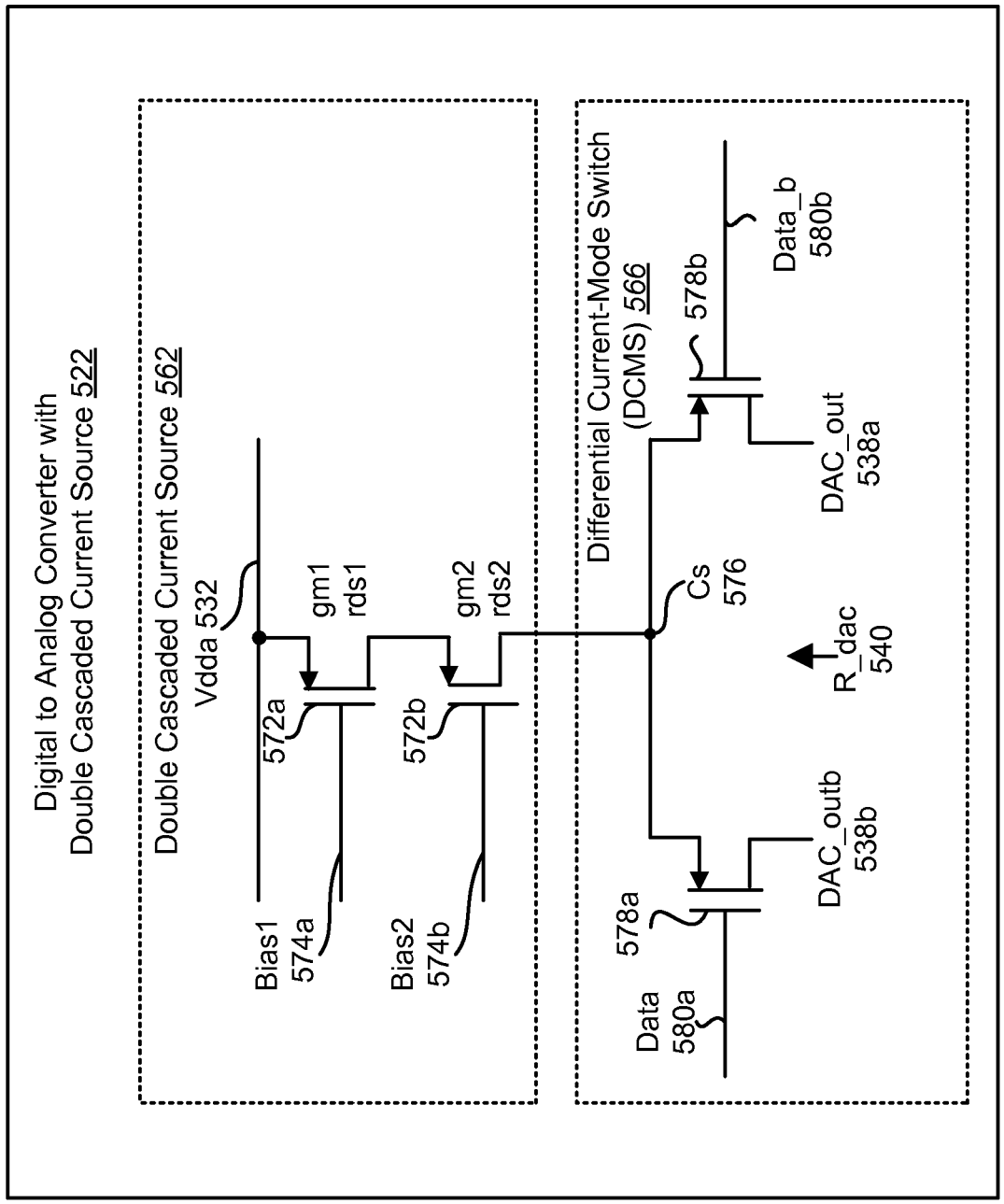
FIG. 5 is a circuit diagram of a DAC with double cascaded current source.

FIG. 5 is a circuit diagram of a DAC with double cascaded current source 522. The DAC with double cascaded current source 522 of FIG. 5 may be one configuration of the DAC with double cascaded current source 422 of FIG. 4. The DAC with double cascaded current source 522 may include a double cascaded current source 562 and a Differential Current-Mode Switch (DCMS) 566. The double cascaded current source 562 may include a first PMOS transistor 572a. The source of the first PMOS transistor 572a may be connected to a rail voltage Vdda 532. The gate of the first PMOS transistor 572a may be connected to a first bias voltage Bias1 574a. The first PMOS transistor 572a may have a first transconductance gm1 571a. The first PMOS transistor 572a may have a first drain-to-source resistance rds1 573a. A higher value for rds 573 may benefit high resolution DACs 522 as shown up in Equation (2) and Equation (3). Because of this reason, double cascodes may be used to increase the resistance R_dac 340. If rds 573 is high enough, double cascodes may not be necessary.

The double cascaded current source 562 may include a second PMOS transistor 572b. The source of the second PMOS transistor 572b may be connected to the drain of the first PMOS transistor 572a. The gate of the second PMOS transistor 572b may be connected to a second bias voltage Bias2 574b. The second PMOS transistor 572b may have a second transconductance gm2 571b and a second drain-to-source resistance rds2 573b. The drain of the second PMOS transistor 572b may be connected to an input node Cs 576 of the Differential Current-Mode Switch (DCMS) 566.

The DCMS 566 may include a third PMOS transistor 578a. The source of the third PMOS transistor 578a may be connected to the input node Cs 576. The gate of the third PMOS transistor 578a may be connected to a first data input Data 580a. The drain of the third PMOS transistor 572a may be connected to a first output DAC_outb 538b.

The DCMS 566 may include a fourth PMOS transistor 578b. The source of the fourth PMOS transistor 578b may be connected to the input node Cs 576. The gate of the fourth PMOS transistor 578b may be connected to a second data input Data_b 580b. The drain of the fourth PMOS transistor 578b may be connected to a second output DAC_out 538a.

The resistance of the DAC with double cascaded current source 522 from the perspective of the outputs 538 is R_dac 540. R_dac 540 may be calculated using Equation 2:

$$R\_dac = gm_2 \cdot rds_2 \cdot rds_1. \quad (2)$$

The ratio of the DAC resistance over the load resistance may be found using Equation (3):

$$R_{ratio} = \frac{R\_dac}{R\_load}. \quad (3)$$

Thus, $R_{ratio}$ is not limited by the external load resistance after the load attenuator 330. A high $R_{ratio}$ may be achieved by using the load attenuation. A high $R_{ratio}$ may provide a better dynamic performance or a better distortion performance. An impedance ratio requirement between current sources and load may require that $$\frac{R\_dac}{R\_load} \geq 2^n$$

where n is the number of bits. The impedance ratio requirement may be achieved using the built-in load attenuator 330. Output swings are not shown in the DAC input node Cs 576 because the load attenuator 330 may set the voltage of DAC_out 338a and DACO_outb 338b to the voltage of REF 350a-b. When output swings are shown in the input node Cs 576 of a DAC 522, the signal or code dependent behavior of the DCMS 566 may be increased. When output swings are not shown in the input node Cs 576, the signal or code dependent behavior of DACs 522 is reduced and the distortions are not degraded as the signal swings grow. This technique may provide reasonable headroom, although the headroom is relatively smaller in the DAC 522 of FIG. 5 than in alternative DAC arrangements. Headroom refers to the minimum voltage required so that the transistors can operate in the saturation region.

Figure 6:
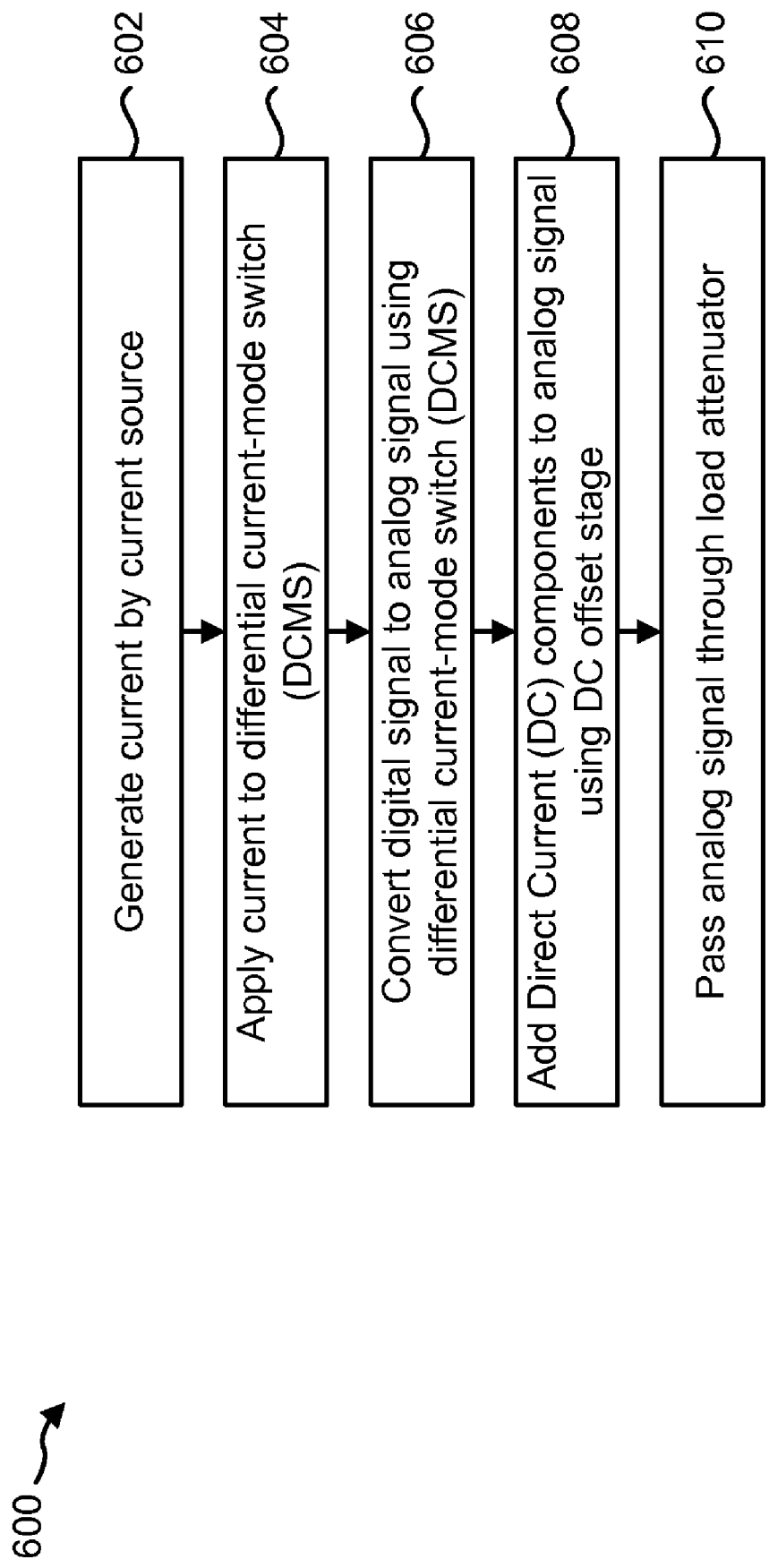
FIG. 6 is a flow diagram of a method for implementing a wideband DAC with built-in load attenuator.

FIG. 6 is a flow diagram of a method 600 for implementing a wideband DAC with built-in load attenuator 310. The method 600 may be performed by a wireless communication device 102. The wireless communication device 102 may generate 602 a current 464 using a current source. The current source may be a double cascaded current source 462. The wireless communication device 102 may then apply 604 the generated current 464 to a DCMS 466. The wireless communication device 102 may convert 606 a digital signal 468 to an analog signal 470 using the DCMS 466. The wireless communication device 102 may add 608 a DC component to the analog signal 470 using a DC offset stage 324. The wireless communication device 102 may then pass 610 the analog signal 470 through a load attenuator 330.

Figure 7:
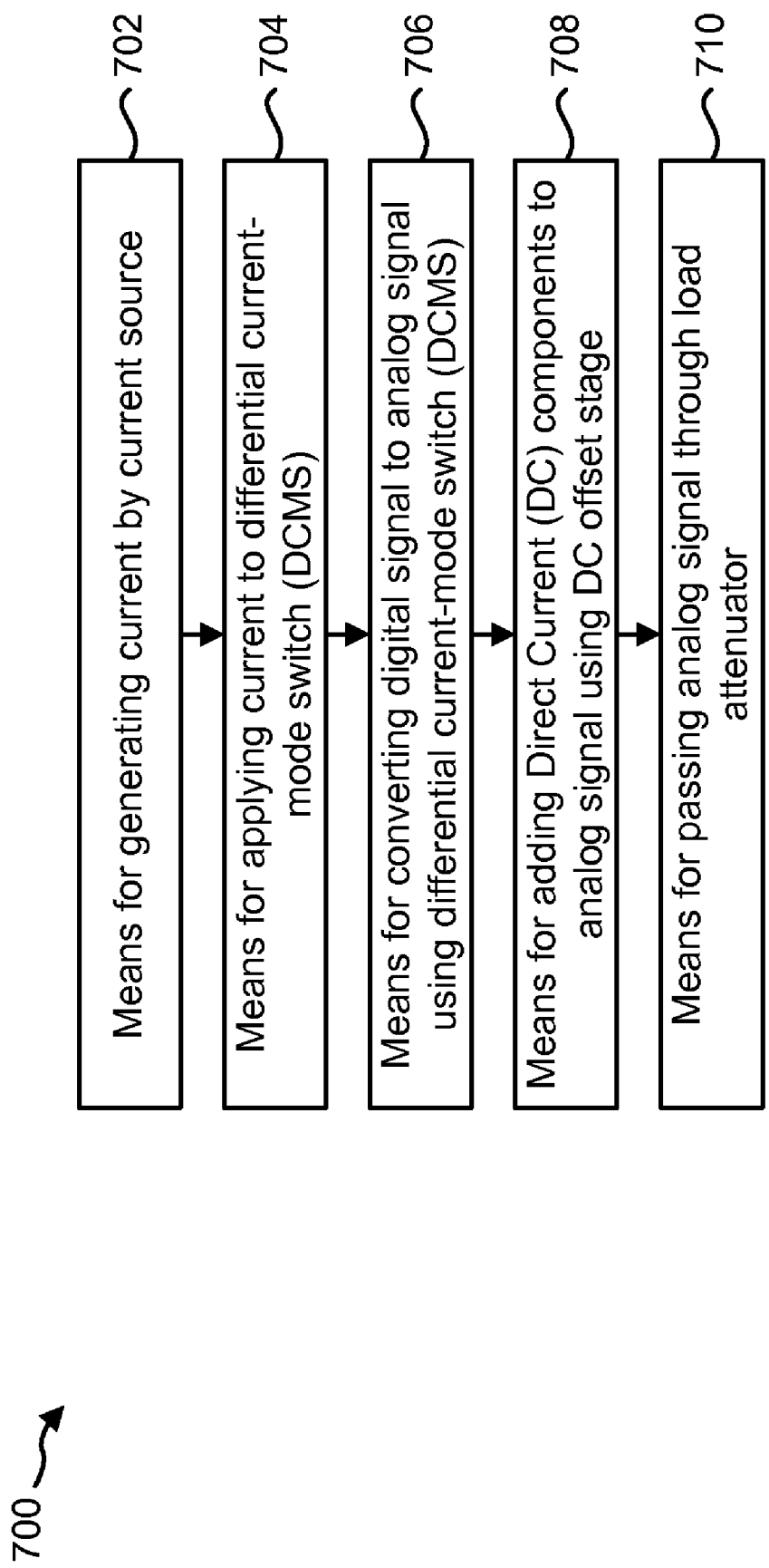
FIG. 7 illustrates means-plus-function blocks corresponding to the method of FIG. 6.

The method 600 of FIG. 6 described above may be performed by various hardware and/or software component(s) and/or module(s) corresponding to the means-plus-function blocks 700 illustrated in FIG. 7. In other words, blocks 602 through 610 illustrated in FIG. 6 correspond to means-plus-function blocks 702 through 710 illustrated in FIG. 7.

Figure 8:
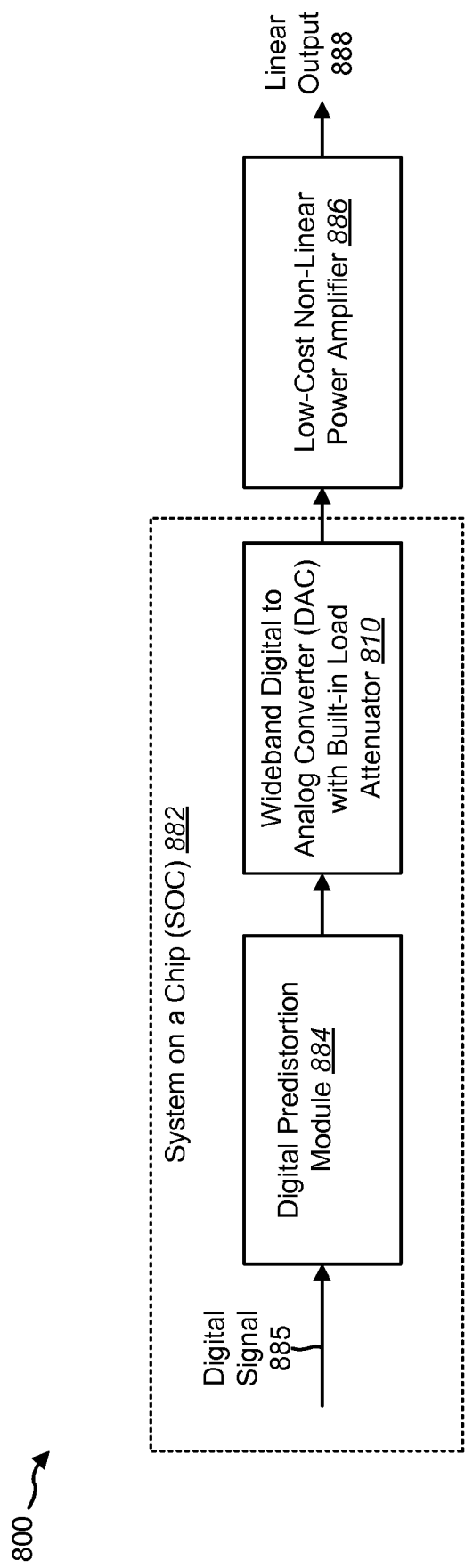
FIG. 8 is a block diagram illustrating data flows for using a wideband DAC with built-in load attenuator in a system-on-a-chip (SOC) to perform digital pre-distortion techniques.

FIG. 8 is a block diagram illustrating data flows 800 for using a wideband DAC with built-in load attenuator 810 in a system-on-a-chip (SOC) 882 to perform digital pre-distortion techniques. The SOC 882 may be a single integrated circuit having all the components of a computer or other electronic system. For example, the SOC 882 may include digital, analog, mixed-signal and radio frequency (RF) functions. The SOC 882 may include a digital predistortion module 884. The digital predistortion module 884 may receive a digital signal 885. The digital predistortion module 884 may have the inverse response of a power amplifier 886 so that the overall response at the output of the power amplifier 886 is linear.

The SOC 882 may include a wideband DAC with built-in load attenuator 810. The wideband DAC with built-in load attenuator 810 of FIG. 8 may be one configuration of the wideband DAC with built-in load attenuator 110 of FIG. 1. The wideband DAC with built-in load attenuator 810 may receive the output of the digital predistortion module 884. The wideband DAC with built-in load attenuator 810 may then output an analog signal to a power amplifier 886. In one configuration, the power amplifier 886 may be a low-cost non-linear power amplifier 886. The power amplifier 886 may then output an acceptably linear output 888.

Figure 9:
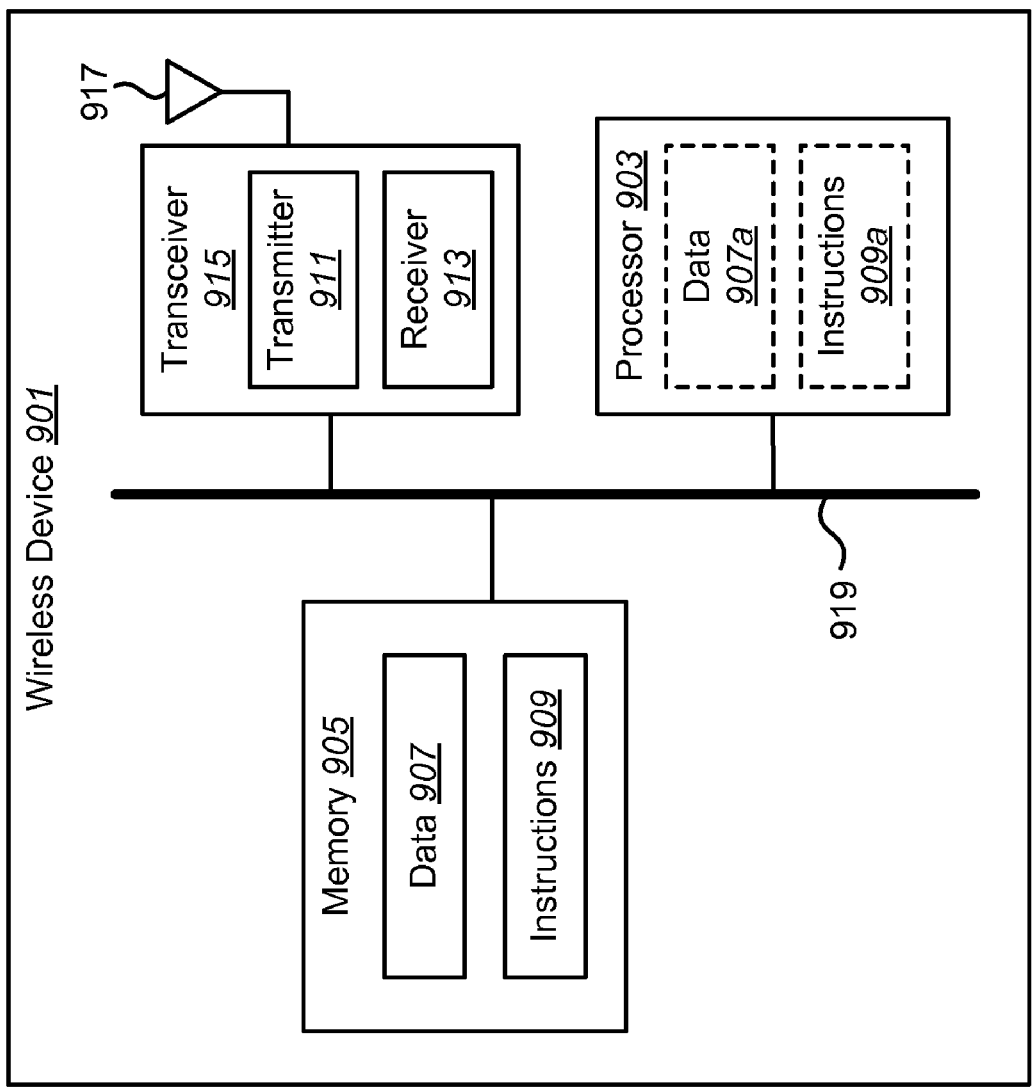
FIG. 9 illustrates certain components that may be included within a wireless device that is configured in accordance with the present disclosure.

FIG. 9 illustrates certain components that may be included within a wireless device 901. The wireless device 901 of FIG. 9 may be one configuration of the wireless communication device 102 of FIG. 1. The wireless device 901 may implement the present systems and methods as disclosed herein.

The wireless device 901 includes a processor 903. The processor 903 may be a general purpose single- or multi-chip microprocessor (e.g., an ARM), a special purpose microprocessor (e.g., a digital signal processor (DSP)), a microcontroller, a programmable gate array, etc. The processor 903 may be referred to as a central processing unit (CPU). Although just a single processor 903 is shown in the wireless device 901 of FIG. 9, in an alternative configuration, a combination of processors (e.g., an ARM and DSP) could be used.

The wireless device 901 also includes memory 905. The memory 905 may be any electronic component capable of storing electronic information. The memory 905 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 907 and instructions 909 may be stored in the memory 905. The instructions 909 may be executable by the processor 903 to implement the methods disclosed herein. Executing the instructions 909 may involve the use of the data 907 that is stored in the memory 905. When the processor 903 executes the instructions 909, various portions of the instructions 909a may be loaded onto the processor 903, and various pieces of data 907a may be loaded onto the processor 903.

The wireless device 901 may also include a transmitter 911 and a receiver 913 to allow transmission and reception of signals to and from the wireless device 901. The transmitter 911 and receiver 913 may be collectively referred to as a transceiver 915. An antenna 917 may be electrically coupled to the transceiver 915. The wireless device 901 may also include multiple transmitters, multiple receivers, multiple transceivers and/or multiple antennas (not shown).

The various components of the wireless device 901 may be coupled together by one or more buses, which may include a power bus, a control signal bus, a status signal bus, a data bus, etc. For the sake of clarity, the various buses are illustrated in FIG. 9 as a bus system 919.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 6, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A circuit for digital-to-analog conversion comprising:
a digital-to-analog converter (DAC), wherein the DAC comprises a double cascaded current source and a differential current-mode switch (DCMS);
a direct current (DC) offset stage; and
a load attenuator, wherein outputs of the DC offset stage are input into the load attenuator, wherein the DC offset stage provides additional currents for the operation of the load attenuator.

2. The circuit of claim 1, wherein the double cascaded current source is between the DCMS and a rail voltage.

3. The circuit of claim 1, wherein outputs of the DAC are input into the load attenuator.

4. The circuit of claim 1, wherein the double cascaded current source comprises:
a first p-type metal-oxide-semiconductor (PMOS) transistor, wherein the source of the first PMOS transistor is connected to a rail voltage and the gate of the first PMOS transistor is connected to a first bias voltage; and
a second PMOS transistor, wherein the source of the second PMOS transistor is connected to the drain of the first PMOS transistor and the gate of the second PMOS transistor is connected to a second bias voltage.

5. The circuit of claim 1, wherein the DCMS comprises:
a first p-type metal-oxide-semiconductor (PMOS) transistor, wherein the source of the first PMOS transistor is connected to an output of the double cascaded current source, the gate of the first PMOS transistor is connected to a first data input, and the drain of the first PMOS transistor is connected to a first output; and
a second PMOS transistor, wherein the source of the second PMOS transistor is connected to the output of the double cascaded current source, the gate of the second PMOS transistor is connected to a second data input, and the drain of the second PMOS transistor is connected to a second output.

6. The circuit of claim 1, wherein a ratio of a resistance of the DAC from the load attenuator to a resistance of the load attenuator from the DAC is not limited by a load resistance.

7. The circuit of claim 1, wherein output swings are not shown in the DAC, reducing the signal/code dependent behavior of the DAC.

8. The circuit of claim 1, wherein a low impedance of an input node of the load attenuator enables the fast discharge of glitch energy.

9. The circuit of claim 1, further comprising a filter connected to an output of the load attenuator.

10. The circuit of claim 1, wherein the DAC is a low-power high-resolution wideband DAC.

11. A circuit for digital-to-analog conversion comprising:
a digital-to-analog converter (DAC), wherein the DAC comprises a double cascaded current source and a differential current-mode switch (DCMS), and wherein the double cascaded current source comprises:
a first p-type metal-oxide-semiconductor (PMOS) transistor, wherein the source of the first PMOS transistor is connected to a rail voltage and the gate of the first PMOS transistor is connected to a first bias voltage; and
a second PMOS transistor, wherein the source of the second PMOS transistor is connected to the drain of the first PMOS transistor and the gate of the second PMOS transistor is connected to a second bias voltage;
a direct current (DC) offset stage; and
a load attenuator, wherein a resistance of the DAC from the load attenuator is equal to a transconductance of the second PMOS transistor times a first resistance times a second resistance, wherein the first resistance is the resistance from the drain to the source of the second PMOS transistor, and wherein the second resistance is the resistance from the drain to the source of the first PMOS transistor.

12. A circuit for digital-to-analog conversion comprising:
a digital-to-analog converter (DAC), wherein the DAC comprises a double cascaded current source and a differential current-mode switch (DCMS);
a direct current (DC) offset stage; and
a load attenuator, wherein the DC offset stage comprises:
a first p-type metal-oxide-semiconductor (PMOS) transistor, wherein the source of the first PMOS transistor is connected to a rail voltage, wherein the drain of the first PMOS transistor is connected to a first output, and wherein the gate of the first PMOS transistor is connected to a PMOS bias voltage (VBP); and
a second PMOS transistor, wherein the source of the second PMOS transistor is connected to a rail voltage, wherein the drain of the second PMOS transistor is connected to a second output, and wherein the gate of the second PMOS transistor is connected to VBP.

13. A circuit for digital-to-analog conversion comprising:
a digital-to-analog converter (DAC), wherein the DAC comprises a double cascaded current source and a differential current-mode switch (DCMS);
a direct current (DC) offset stage; and
a load attenuator, wherein the load attenuator comprises:
a first amplifier, wherein a positive input of the first amplifier receives a first reference signal;
a first p-type metal-oxide-semiconductor (PMOS) transistor, wherein the source of the first PMOS transistor is connected to a first input of the load attenuator and to a negative input of the first amplifier, wherein the gate of the first PMOS transistor is connected to the output of the first amplifier, and wherein the drain of the first PMOS transistor is connected to a first output of the load attenuator;
a second amplifier, wherein a positive input of the second amplifier receives a second reference signal; and
a second PMOS transistor, wherein the source of the second PMOS transistor is connected to a second input of the load attenuator and to a negative input of the second amplifier, wherein the gate of the second PMOS transistor is connected to an output of the second amplifier, and wherein the drain of the second PMOS transistor is connected to a second output of the load attenuator.

14. The circuit of claim 13, wherein the first and second amplifiers have a transfer function, wherein the first PMOS transistor and the second PMOS transistor have a transconductance, and wherein a resistance of the load attenuator from the DAC is one over the quotient of the transfer function and the transconductance.

15. A method for implementing a wideband digital to analog converter (DAC) with built-in load attenuator comprising:
generating a current by a current source, wherein the current source is a double cascaded current source;
applying the generated current to a differential current-mode switch (DCMS);
converting a digital signal to an analog signal using the DCMS;
passing the analog signal through a load attenuator; and
adding a direct current (DC) component to the analog signal using a DC offset stage, wherein the DC offset stage provides additional currents for the operation of the load attenuator.

16. The method of claim 15, wherein the double cascaded current source is between the DCMS and a rail voltage.

17. The method of claim 15, wherein outputs of the DC offset stage are input into the load attenuator.

18. The method of claim 15, wherein the double cascaded current source comprises:
a first p-type metal-oxide-semiconductor (PMOS) transistor, wherein the source of the first PMOS transistor is connected to a rail voltage and the gate of the first PMOS transistor is connected to a first bias voltage; and
a second PMOS transistor, wherein the source of the second PMOS transistor is connected to the drain of the first PMOS transistor and the gate of the second PMOS transistor is connected to a second bias voltage.

19. The method of claim 15, wherein the DCMS comprises:
a first p-type metal-oxide-semiconductor (PMOS) transistor, wherein the source of the first PMOS transistor is connected to an output of the double cascaded current source, the gate of the first PMOS transistor is connected to a first data input, and the drain of the first PMOS transistor is connected to a first output; and
a second PMOS transistor, wherein the source of the second PMOS transistor is connected to the output of the double cascaded current source, the gate of the second PMOS transistor is connected to a second data input, and the drain of the second PMOS transistor is connected to a second output.

20. The method of claim 15, wherein a ratio of a resistance of the DAC from the load attenuator to a resistance of the load attenuator from the DAC is not limited by a load resistance.

21. The method of claim 15, wherein output swings are not shown in the DAC, reducing the signal/code dependent behavior of the DAC.

22. The method of claim 15, wherein a low impedance of an input node of the load attenuator enables the fast discharge of glitch energy.

23. The method of claim 15, further comprising filtering an output of the load attenuator.

24. The method of claim 15, wherein the DAC is a low-power high-resolution wideband DAC.

25. A method for implementing a wideband digital to analog converter (DAC) with built-in load attenuator comprising:
generating a current by a current source, wherein the current source is a double cascaded current source, wherein the double cascaded current source comprises:
a first p-type metal-oxide-semiconductor (PMOS) transistor, wherein the source of the first PMOS transistor is connected to a rail voltage and the gate of the first PMOS transistor is connected to a first bias voltage; and
a second PMOS transistor, wherein the source of the second PMOS transistor is connected to the drain of the first PMOS transistor and the gate of the second PMOS transistor is connected to a second bias voltage;
applying the generated current to a differential current-mode switch (DCMS);
converting a digital signal to an analog signal using the DCMS; and
passing the analog signal through a load attenuator, wherein a resistance of the DAC from the load attenuator is equal to a transconductance of the second PMOS transistor times a first resistance times a second resistance, wherein the first resistance is the resistance from the drain to the source of the second PMOS transistor, and wherein the second resistance is the resistance from the drain to the source of the first PMOS transistor.

26. A method for implementing a wideband digital to analog converter (DAC) with built-in load attenuator comprising:
generating a current by a current source, wherein the current source is a double cascaded current source;
applying the generated current to a differential current-mode switch (DCMS);
converting a digital signal to an analog signal using the DCMS;
passing the analog signal through a load attenuator; and
adding a direct current (DC) component to the analog signal using a DC offset stage, wherein the DC offset stage comprises:
a first p-type metal-oxide-semiconductor (PMOS) transistor, wherein the source of the first PMOS transistor is connected to a rail voltage, wherein the drain of the first PMOS transistor is connected to a first output, and wherein the gate of the first PMOS transistor is connected to a PMOS bias voltage (VBP); and
a second PMOS transistor, wherein the source of the second PMOS transistor is connected to a rail voltage, wherein the drain of the second PMOS transistor is connected to a second output, and wherein the gate of the second PMOS transistor is connected to VBP.

27. A method for implementing a wideband digital to analog converter (DAC) with built-in load attenuator comprising:
generating a current by a current source, wherein the current source is a double cascaded current source;
applying the generated current to a differential current-mode switch (DCMS);
converting a digital signal to an analog signal using the DCMS; and
passing the analog signal through a load attenuator; wherein the load attenuator comprises:
a first amplifier, wherein a positive input of the first amplifier receives a first reference signal;
a first p-type metal-oxide-semiconductor (PMOS) transistor, wherein the source of the first PMOS transistor is connected to a first input of the load attenuator and to a negative input of the first amplifier, wherein the gate of the first PMOS transistor is connected to the output of the first amplifier, and wherein the drain of the first PMOS transistor is connected to a first output of the load attenuator;
a second amplifier, wherein a positive input of the second amplifier receives a second reference signal; and
a second PMOS transistor, wherein the source of the second PMOS transistor is connected to a second input of the load attenuator and to a negative input of the second amplifier, wherein the gate of the second PMOS transistor is connected to an output of the second amplifier, and wherein the drain of the second PMOS transistor is connected to a second output of the load attenuator.

28. The method of claim 27, wherein the first and second amplifiers have a transfer function, wherein the first PMOS transistor and the second PMOS transistor have a transconductance, and wherein a resistance of the load attenuator from the DAC is one over the quotient of the transfer function and the transconductance.

29. A wireless device having a wideband digital to analog converter (DAC) with built-in load attenuator, comprising:
means for generating a current by a current source, wherein the current source is a double cascaded current source;
means for applying the generated current to a differential current-mode switch (DCMS);
means for converting a digital signal to an analog signal using the DCMS;
means for passing the analog signal through a load attenuator; and
means for adding a direct current (DC) component to the analog signal using a DC offset stage, wherein the DC offset stage provides additional currents for the operation of the load attenuator.

30. A computer-program product for a wideband digital to analog converter (DAC) with built-in load attenuator, the computer-program product comprising a computer-readable medium having instructions thereon, the instructions comprising:
code for generating a current by a current source, wherein the current source is a double cascaded current source;
code for applying the generated current to a differential current-mode switch (DCMS);
code for converting a digital signal to an analog signal using the DCMS;
code for passing the analog signal through a load attenuator; and
code for adding a direct current (DC) component to the analog signal using a DC offset stage, wherein the DC offset stage provides additional currents for the operation of the load attenuator.

* * * * *